(12) United States Patent  
Ju et al.

(10) Patent No.: US 10,957,517 B2  
(45) Date of Patent: Mar. 23, 2021

(54) SUBSTRATE TREATING APPARATUS AND TEMPERATURE CONTROL METHOD FOR GAS DISTRIBUTION PLATE

(71) Applicant: SEMES CO., LTD., Cheonan-si (KR)

(72) Inventors: Yunsik Ju, Yongin-si (KR); Sangbo Seo, Yongin-si (KR); Byeong Hyeon Kong, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 16/695,386

(22) Filed: Nov. 26, 2019

(65) Prior Publication Data

US 2020/0176224 A1 Jun. 4, 2020

(30) Foreign Application Priority Data

Nov. 30, 2018 (KR) .......................... 10-2018-0152227

(51) Int. Cl.
*H01J 37/32* (2006.01)

(52) U.S. Cl.
CPC .. *H01J 37/32449* (2013.01); *H01J 37/32724* (2013.01); *H01J 2237/002* (2013.01); *H01J 2237/24585* (2013.01); *H01J 2237/334* (2013.01)

(58) Field of Classification Search
CPC .......... H01J 37/32724; H01J 37/32449; H01J 2237/334; H01J 2237/24585; H01J 2237/002

See application file for complete search history.

(56) References Cited

FOREIGN PATENT DOCUMENTS

| JP | H10335340 A | 12/1998 |
|---|---|---|
| KR | 10-2007-0015599 A | 2/2007 |
| KR | 10-1061951 B1 | 9/2011 |
| KR | 10-2016-0146534 A | 12/2016 |
| KR | 10-2018-0059900 A | 6/2018 |
| KR | 10-1997145 B1 | 7/2019 |

*Primary Examiner* — Yuechuan Yu
(74) *Attorney, Agent, or Firm* — Harness, Dickey & Pierce, P.L.C.

(57) ABSTRACT

Disclosed is a substrate treating apparatus including a chamber having a process space therein in which a substrate is treated, a substrate support assembly located in the chamber and including a support plate that supports the substrate, a gas supply unit that supplies gas into the chamber, a gas distribution plate that distributes the gas and supplies the gas into the process space, and a temperature control unit that controls temperature of the gas distribution plate. The temperature control unit includes a heating member that heats the gas distribution plate, a cooling member that cools the gas distribution plate, and a control member that controls the heating member and the cooling member, based on a correlation coefficient regarding an interaction of the heating member and the cooling member and a disturbance coefficient regarding an external influence.

9 Claims, 3 Drawing Sheets

SUBSTRATE TREATING APPARATUS AND TEMPERATURE CONTROL METHOD FOR GAS DISTRIBUTION PLATE

CROSS-REFERENCE TO RELATED APPLICATIONS

A claim for priority under 35 U.S.C. § 119 is made to Korean Patent Application No. 10-2018-0152227 filed on Nov. 30, 2018, in the Korean Intellectual Property Office, the entire contents of which are hereby incorporated by reference.

BACKGROUND

Embodiments of the inventive concept described herein relate to a substrate treating apparatus and a temperature control method for a gas distribution plate, and more particularly, relate to a substrate treating apparatus including a controller for compensating for disturbances and a method for controlling the temperature of a gas distribution plate of the substrate treating apparatus.

In a process of manufacturing semiconductor elements, various processes, such as photolithography, etching, thin-film deposition, ion implantation, cleaning, and the like, are performed. A substrate treating apparatus using plasma is used for the etching, thin-film deposition, and cleaning processes among these processes.

In the etching process, a gas distribution plate (GDP) serves to distribute gases necessary for the etching process, make the flow of the gases into a chamber uniform, and reduce a gas reaction in a plasma environment. The gas distribution plate has to be maintained at a specific temperature to prevent the occurrence of a gas reaction because a deposition reaction of gas is greatly affected by temperature. To achieve this, the temperature of the gas distribution plate is controlled by controlling valves of a heater and a cooler located at the top of the chamber using PID controllers or by turning on/off the valves. The controllers for the heater and the cooler form independent control loops, respectively, but actually interfere with each other. Therefore, it is difficult to design the controllers.

Furthermore, precise process environments are required due to gradually intensified fine processes, and RF power generated for the etching process greatly affects the temperature of the gas distribution plate. Accordingly, a temperature control method for the gas distribution plate that is more precise and has high resistance to disturbances is required.

SUMMARY

Embodiments of the inventive concept provide a substrate treating apparatus for controlling the temperature of a gas distribution plate in consideration of an interaction of a heating member and a cooling member and an external influence, and a temperature control method for the gas distribution plate.

According to an exemplary embodiment, an apparatus for treating a substrate includes a chamber having a process space therein in which the substrate is treated, a substrate support assembly located in the chamber and including a support plate that supports the substrate, a gas supply unit that supplies gas into the chamber, a gas distribution plate that distributes the gas and supplies the gas into the process space, and a temperature control unit that controls temperature of the gas distribution plate. The temperature control unit includes a heating member that heats the gas distribution plate, a cooling member that cools the gas distribution plate, and a control member that controls the heating member and the cooling member, based on a correlation coefficient regarding an interaction of the heating member and the cooling member and a disturbance coefficient regarding an external influence.

The control member may include a filter that removes feedback inputs from input signals that are input to the heating member and the cooling member, depending on the correlation coefficient and the disturbance coefficient.

The feedback inputs may be calculated by equation $u_d = QP^{-1}(d_i + d_e)$, where $u_d$ is the feedback input, $Q$ is a transfer function of the filter, $P$ is a transfer function of the heating member or the cooling member, $d_i$ is the correlation coefficient, and $d_e$ is the disturbance coefficient.

The filter may determine the Q value based on the correlation coefficient and the disturbance coefficient.

The filter may be implemented with a plurality of filters having different Q values, and the control member may further include a controller that switches the plurality of filters such that any one of the plurality of filters is provided in the heating member and the cooling member.

The control member may simultaneously control the heating member and the cooling member.

The control member may further include a storage unit that stores the correlation coefficient and the disturbance coefficient, and the filter may control the heating member and the cooling member by using the correlation coefficient and the disturbance coefficient stored in the storage unit.

The control member may further include an input unit that receives the correlation coefficient and the disturbance coefficient from the outside, and when at least one of the correlation coefficient and the disturbance coefficient is input to the input unit, the storage unit may replace at least one of the correlation coefficient and the disturbance coefficient stored in the storage unit with the value input to the input unit.

The control member may further include a first sensor that measures temperatures of the heating member and the cooling member and a second sensor that measures temperature in the chamber. The correlation coefficient may be set based on the temperature measured by the first sensor, and the disturbance coefficient may be set based on the temperature measured by the second sensor.

According to an exemplary embodiment, a method for controlling temperature of a gas distribution plate that distributes gas supplied into a chamber includes controlling temperatures of a heating member and a cooling member, based on a correlation coefficient regarding an interaction of the heating member and the cooling member and a disturbance coefficient regarding an external influence, in which the heating member heats the gas distribution plate and the cooling member cools the gas distribution plate. The temperature of the gas distribution plate is controlled by removing feedback inputs from input signals that are input to the heating member and the cooling member, depending on the correlation coefficient and the disturbance coefficient.

The feedback inputs may be calculated by equation $u_d = QP^{-1}(d_i + d_e)$, where $u_d$ is the feedback input, $Q$ is a transfer function of a filter, $P$ is a transfer function of the heating member or the cooling member, $d_i$ is the correlation coefficient, and $d_e$ is the disturbance coefficient.

The Q value may be determined based on the correlation coefficient and the disturbance coefficient.

The temperature control of the heating member and the cooling member may be performed by simultaneously controlling the heating member and the cooling member.

The correlation coefficient and the disturbance coefficient may be values previously stored in a storage unit.

The correlation coefficient and the disturbance coefficient may be values input from the outside.

The correlation coefficient may be determined based on temperatures of the heating member and the cooling member that are measured by a first sensor, and the disturbance coefficient may be determined based on temperature in the chamber that is measured by a second sensor.

According to an exemplary embodiment, a method for controlling temperature of a gas distribution plate that distributes gas supplied into a chamber includes controlling temperatures of a heating member and a cooling member, based on a correlation coefficient regarding an interaction of the heating member and the cooling member, in which the heating member heats the gas distribution plate and the cooling member cools the gas distribution plate. The temperature of the gas distribution plate is controlled by removing feedback inputs from input signals that are input to the heating member and the cooling member, depending on the correlation coefficient.

The feedback inputs may be calculated by equation $u_d = QP^{-1}d_i$, where $u_d$ is the feedback input, Q is a transfer function of a filter, P is a transfer function of the heating member or the cooling member, and $d_i$ is the correlation coefficient.

The Q value may be determined based on the correlation coefficient.

The temperature control of the heating member and the cooling member may be performed by simultaneously controlling the heating member and the cooling member.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Other advantages and features of the inventive concept, and implementation methods thereof will be clarified through the following embodiments to be described in detail with reference to the accompanying drawings. The inventive concept may, however, be embodied in different forms and should not be construed as being limited to the embodiments set forth herein. Rather, these embodiments are provided so that the inventive concept is thorough and complete and fully conveys the scope of the inventive concept to a person skilled in the art to which the inventive concept pertains. Further, the inventive concept is only defined by the appended claims.

Even though not defined, all terms used herein (including technical or scientific terms) have the same meanings as those generally accepted by general technologies in the related art to which the inventive concept pertains. The terms defined in general dictionaries may be construed as having the same meanings as those used in the related art and/or a text of the present application and even when some terms are not clearly defined, they should not be construed as being conceptual or excessively formal.

Terms used herein are only for description of embodiments and are not intended to limit the inventive concept. As used herein, the singular forms are intended to include the plural forms as well, unless context clearly indicates otherwise. It will be further understood that the terms "comprise" and/or "comprising" used herein specify the presence of stated features or components, but do not preclude the presence or addition of one or more other features or components. In the specification, the term "and/or" indicates each of listed components or various combinations thereof.

Figure 1:
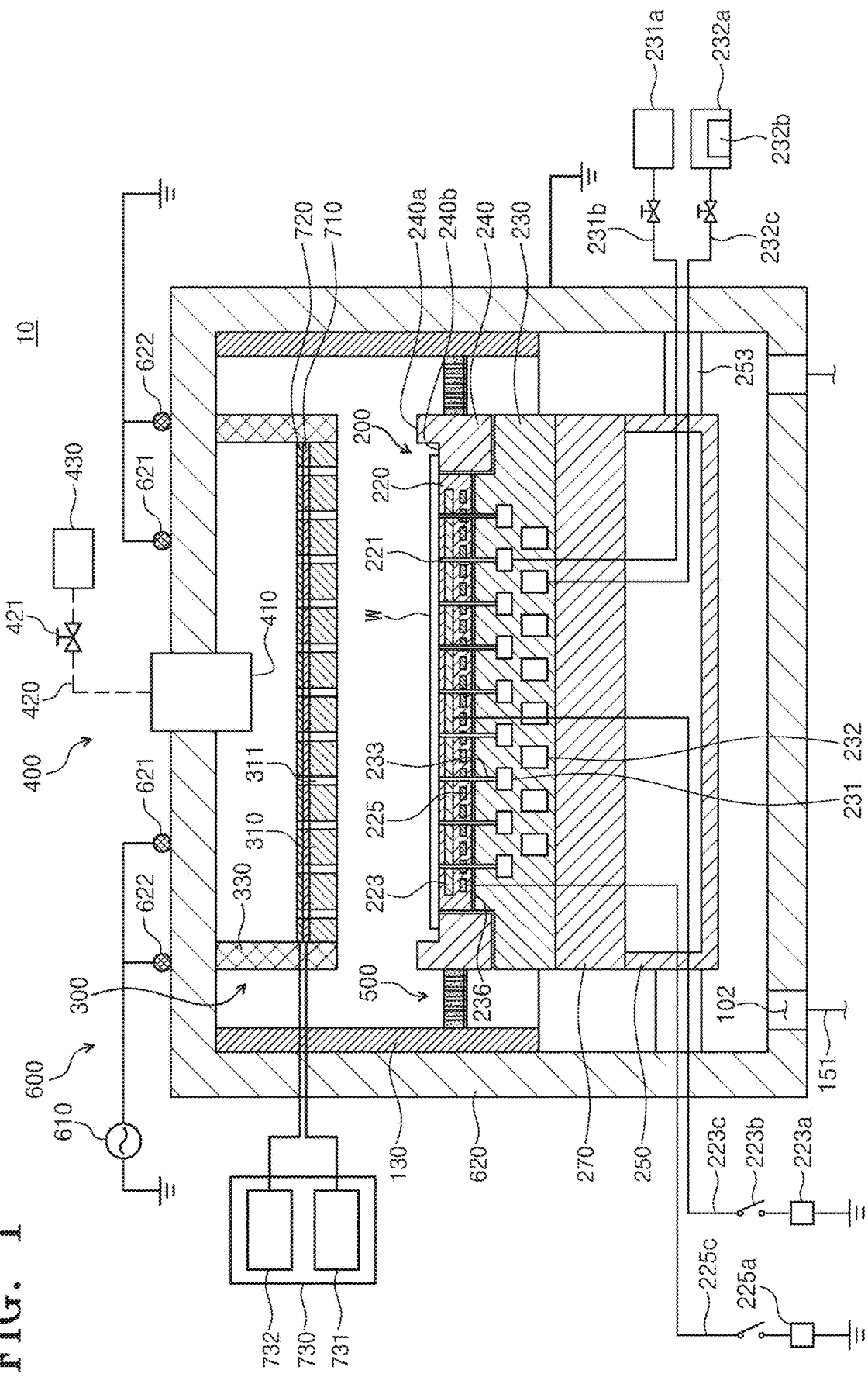
FIG. 1 is an exemplary view illustrating a substrate treating apparatus according to an embodiment of the inventive concept.

FIG. 1 is an exemplary view illustrating a substrate treating apparatus according to an embodiment of the inventive concept.

Referring to FIG. 1, the substrate treating apparatus 10 treats a substrate W using plasma. For example, the substrate treating apparatus 10 may perform an etching process on the substrate W. The substrate treating apparatus 10 may include a chamber 620, a substrate support assembly 200, a showerhead 300, a gas supply unit 400, a baffle unit 500, and a plasma generation unit 600.

The chamber 620 may provide a process space in which a substrate treating process is performed. The chamber 620 may have the process space therein and may have an enclosed shape. The chamber 620 may be formed of a metal material. The chamber 620 may be formed of an aluminum material. The chamber 620 may be grounded. The chamber 620 may have an exhaust hole 102 formed in the bottom thereof. The exhaust hole 102 may be connected with an exhaust line 151. Reaction byproducts generated in the substrate treating process and gases staying in the interior space of the chamber 620 may be discharged to the outside through the exhaust line 151. The pressure in the chamber 620 may be reduced to a predetermined pressure by the exhaust process.

According to an embodiment, a liner 130 may be provided in the chamber 620. The liner 130 may have a cylindrical shape that is open at the top and the bottom thereof. The liner 130 may make contact with the inner side of the chamber 620. The liner 130 may protect the inner wall of the chamber 620 to prevent the inner wall of the chamber 620 from being damaged by arc discharge. Furthermore, the liner 130 may prevent impurities generated during the substrate treating process from being deposited on the inner wall of the chamber 620.

Alternatively, the liner 130 may not be provided.

The substrate support assembly 200 may be located in the chamber 620. The substrate support assembly 200 may support the substrate W. The substrate support assembly 200 may include an electrostatic chuck 210 that electro-statically clamps the substrate W. Alternatively, the substrate support assembly 200 may support the substrate W in various manners such as mechanical clamping. Hereinafter, the substrate support assembly 200 including the electrostatic chuck 210 will be described.

The substrate support assembly 200 may include the electrostatic chuck 210, a lower cover 250, and a plate 270. The substrate support assembly 200 may be located in the chamber 620 and may be spaced apart upward from the bottom of the chamber 620. The substrate support assembly 200 may be implemented with a support plate.

The electrostatic chuck 210 may include a dielectric plate 220, a body 230, and a focus ring 240. The electrostatic chuck 210 may support the substrate W. The dielectric plate 220 may be located at the top of the electrostatic chuck 210. The dielectric plate 220 may be formed of a dielectric substance in a circular plate shape. The substrate W may be placed on the top side of the dielectric plate 220. The top side of the dielectric plate 220 may have a smaller radius than the substrate W. Due to this, the edge region of the substrate W may be located outside the dielectric plate 220.

The dielectric plate 220 may include a first electrode 223, a heating unit 225, and a first supply channel 221 inside. The first supply channel 221 may extend from the top side of the dielectric plate 210 to the bottom side thereof. A plurality of first supply channels 221 may be formed to be spaced apart from each other and may serve as passages through which a heat transfer medium is supplied to the backside of the substrate W.

The first electrode 223 may be electrically connected with a first power supply 223a. The first power supply 223a may include a direct current (DC) power supply. A switch 223b may be installed between the first electrode 223 and the first power supply 223a. The first electrode 223 may be electrically connected with, or disconnected from, the first power supply 223a by turning on/off the switch 223b. When the switch 223b is turned on, DC current may be applied to the first electrode 223. Electrostatic force may be applied between the first electrode 223 and the substrate W by the current applied to the first electrode 223, and the substrate W may be clamped to the dielectric plate 220 by the electrostatic force.

The heating unit 225 may be located under the first electrode 223. The heating unit 225 may be electrically connected with a second power supply 225a. The heating unit 225 may generate heat by resisting electric current applied by the second power supply 225a. The generated heat may be transferred to the substrate W through the dielectric plate 220. The substrate W may be maintained at a predetermined temperature by the heat generated from the heating unit 225. The heating unit 225 may include a spiral coil.

The body 230 may be located under the dielectric plate 220. The bottom side of the dielectric plate 220 and the top side of the body 230 may be bonded together by an adhesive 236. The body 230 may be formed of an aluminum material. The top side of the body 230 may have a central region located in a higher position than an edge region thereof. The central region of the top side of the body 230 may have an area corresponding to that of the bottom side of the dielectric plate 220 and may be bonded to the bottom side of the dielectric plate 220. The body 230 may have a first circulation channel 231, a second circulation channel 232, and a second supply channel 233 formed therein.

The first circulation channel 231 may serve as a passage through which the heat transfer medium circulates. The first circulation channel 231 may be formed in a spiral shape in the body 230. Alternatively, the first circulation channel 231 may include ring-shaped fluid channels with different radii that are arranged to have the same center. The first circulation channels 231 may be connected together. The first circulation channels 231 may be formed at the same height.

The second circulation channel 232 may serve as a passage through which a cooling fluid circulates. The second circulation channel 232 may be formed in a spiral shape in the body 230. Alternatively, the second circulation channel 232 may include ring-shaped fluid channels with different radii that are arranged to have the same center. The second circulation channels 232 may be connected together. The second circulation channels 232 may have a larger cross-sectional area than the first circulation channel 231. The second circulation channels 232 may be formed at the same height. The second circulation channels 232 may be located under the first circulation channel 231.

The second supply channel 233 may extend upward from the first circulation channel 231 to the top side of the body 230. As many second supply channels 233 as the first supply channels 221 may be provided, and the second supply channel 233 may connect the first circulation channel 231 and the first supply channel 221.

The first circulation channel 231 may be connected with a heat transfer medium reservoir 231a through a heat transfer medium supply line 231b. The heat transfer medium may be stored in the heat transfer medium reservoir 231a. The heat transfer medium may include an inert gas. According to an embodiment, the heat transfer medium may include a helium (He) gas. The helium gas may be supplied into the first circulation channel 231 through the heat transfer medium supply line 231b and then supplied to the backside of the substrate W via the second supply channel 233 and the first supply channel 221 in a serial order. The helium gas may serve as a medium through which heat transferred from plasma to the substrate W is transferred to the electrostatic chuck 210.

The second circulation channel 232 may be connected with a cooling fluid reservoir 232a through a cooling fluid supply line 232c. The cooling fluid may be stored in the cooling fluid reservoir 232a. The cooling fluid reservoir 232a may include a cooler 232b therein. The cooler 232b may cool the cooling fluid to a predetermined temperature. Alternatively, the cooler 232b may be installed on the cooling fluid supply line 232c. The cooling fluid supplied into the second circulation channel 232 through the cooling fluid supply line 232c may cool the body 230 while circulating along the second circulation channel 232. The body 230, while being cooled, may cool the dielectric plate 220 and the substrate W together to maintain the substrate W at a predetermined temperature.

The body 230 may include a metal plate. According to an embodiment, the entire body 230 may be implemented with a metal plate.

The focus ring 240 may be disposed on the edge region of the electrostatic chuck 210. The focus ring 240 may have a ring shape and may be disposed around the dielectric plate 220. The top side of the focus ring 240 may have an outer portion 240a located in a higher position than an inner portion 240b thereof. The inner portion 240b of the top side of the focus ring 240 may be located at the same height as the top side of the dielectric plate 220. The inner portion 240b of the top side of the focus ring 240 may support the edge region of the substrate W that is located outside the dielectric plate 220. The outer portion 240a of the focus ring 240 may surround the edge region of the substrate W. The focus ring 240 may control an electromagnetic field such that plasma density is uniformly distributed over the entire region of the substrate W. Accordingly, plasma may be uniformly formed over the entire region of the substrate W, and thus regions of the substrate W may be uniformly etched.

The lower cover 250 may be located at the bottom of the substrate support assembly 200. The lower cover 250 may be spaced apart upward from the bottom of the chamber 620. The lower cover 250 may have a space 255 formed therein, which is open at the top. The outer radius of the lower cover 250 may be the same as the outer radius of the body 230. The lower cover 250 may include, in the interior space 255, a lift pin module (not illustrated) that moves the transferred substrate W from an external transfer member to the electrostatic chuck 210. The lift pin module (not illustrated) may be spaced apart from the lower cover 250 by a predetermined gap. The bottom side of the lower cover 250 may be formed of a metal material. The lower cover 250 may have air in the interior space 255. The air may serve to reduce an electromagnetic field in the substrate support assembly 200 because the air has a lower permittivity than an insulator.

The lower cover 250 may have a connecting member 253. The connecting member 253 may connect the outer side of the lower cover 250 and the inner wall of the chamber 620. A plurality of connecting members 253 may be provided on the outer side of the lower cover 250 at predetermined intervals. The connecting member 253 may support the substrate support assembly 200 in the chamber 620. Furthermore, the connecting member 253 may be connected with the inner wall of the chamber 620 to allow the lower cover 250 to be electrically grounded. A first power line 223c connected with the first power supply 223a, a second power line 225c connected with the second power supply 225a, the heat transfer medium supply line 231b connected with the heat transfer medium reservoir 231a, and the cooling fluid supply line 232c connected with the cooling fluid reservoir 232a may extend into the lower cover 250 through the interior space 255 of the connecting member 253.

The plate 270 may be located between the electrostatic chuck 210 and the lower cover 250. The plate 270 may cover the top side of the lower cover 250. The plate 270 may have a cross-sectional area corresponding to that of the body 230. The plate 270 may include an insulator. According to an embodiment, one or more plates 270 may be provided. The plate 270 may serve to increase the electrical distance between the body 230 and the lower cover 250.

The showerhead 300 may be located over the substrate support assembly 200 in the chamber 620. The showerhead 300 may be located to be opposite the substrate support assembly 200.

The showerhead 300 may include a gas distribution plate 310, a support part 330, and a temperature control unit 700. The gas distribution plate 310 may be spaced apart downward from the top side of the chamber 620 by a predetermined distance. A predetermined space may be formed between the gas distribution plate 310 and the top side of the chamber 620. The gas distribution plate 310 may have a plate shape with a constant thickness. The bottom side of the gas distribution plate 310 may be anodized to prevent an electric arc caused by plasma. The gas distribution plate 310 may have the same cross-sectional shape and area as the substrate support assembly 200. The gas distribution plate 310 may include a plurality of injection holes 311. The injection holes 311 may be vertically formed through the top side and the bottom side of the gas distribution plate 310. The gas distribution plate 310 may contain a metal material.

The support part 330 may support the side of the gas distribution plate 310. The support part 330 may be connected, at the upper end thereof, with the top side of the chamber 620 and may be connected, at the lower end thereof, with the side of the gas distribution plate 310. The support part 330 may contain a nonmetal material.

The temperature control unit 700 may control the temperature of the gas distribution plate 310. The temperature control unit 700 may include a heating member 710 that heats the gas distribution plate 310, a cooling member 720 that cools the gas distribution plate 310, and a control member 730 that controls the heating member 710 and the cooling member 720. The temperature control unit 700 may control the heating member 710 and the cooling member 720 in consideration of an interaction of the heating member 710 and the cooling member 720 and an external influence, thereby more accurately controlling the temperature of the gas distribution plate 310. A specific method of controlling the temperature of the gas distribution plate 310 by the temperature control unit 700 will be described below in detail with reference to FIGS. 2 to 4.

The gas supply unit 400 may supply a process gas into the chamber 620. The gas supply unit 400 may include a gas supply nozzle 410, a gas supply line 420, and a gas reservoir 430. The gas supply nozzle 410 may be attached to the center of the top side of the chamber 620. The gas supply nozzle 410 may have an injection hole formed in the bottom thereof. The injection hole may be used to supply the process gas into the chamber 620. The gas supply line 420 may connect the gas supply nozzle 410 and the gas reservoir 430. The gas supply line 420 may supply the process gas stored in the gas reservoir 430 to the gas supply nozzle 410. A valve 421 may be installed in the gas supply line 420. The valve 421 may open or close the gas supply line 420 and may regulate the flow rate of the process gas supplied through the gas supply line 420.

The baffle unit 500 may be located between the inner wall of the chamber 620 and the substrate support assembly 200. A baffle 510 may have an annular ring shape. The baffle 510 may have a plurality of through-holes 511 formed therein. The process gas supplied into the chamber 620 may pass through the through-holes 511 of the baffle 510 and may be discharged through the exhaust hole 102. The flow of the process gas may be controlled depending on the shape of the baffle 510 and the shape of the through-holes 511.

The plasma generation unit 600 may excite the process gas in the chamber 620 into a plasma state. According to an embodiment of the inventive concept, the plasma generation unit 600 may be of an inductively coupled plasma (ICP) type. In this case, as illustrated in FIG. 1, the plasma generation unit 600 may include an RF power supply 610 that supplies RF power, and a first coil 621 and a second coil 622 that are electrically connected to the RF power supply 610 to receive RF power.

The first coil 621 and the second coil 622 may be disposed in positions facing the substrate W. For example, the first coil 621 and the second coil 622 may be disposed on the top side of the chamber 620. The first coil 621 may have a smaller diameter than the second coil 622 and may be located on an inner portion of the top side of the chamber 620, and the second coil 622 may be located on an outer portion of the top side of the chamber 620. The first coil 621 and the second coil 622 may receive RF power from the RF power supply 610 and may induce a time varying electromagnetic field in the chamber 620. Accordingly, the process gas supplied into the chamber 620 may be excited into plasma.

Hereinafter, a process of treating the substrate W using the substrate treating apparatus 10 will be described.

When the substrate W is placed on the substrate support assembly 200, DC current may be applied from the first power supply 233a to the first electrode 233. Electrostatic force may be applied between the first electrode 223 and the substrate W by the DC current applied to the first electrode 223, and the substrate W may be clamped to the electrostatic chuck 210 by the electrostatic force.

When the substrate W is clamped to the electrostatic chuck 210, the process gas may be supplied into the chamber 620 through the gas supply nozzle 410. The process gas may be uniformly injected into the chamber 620 through the injection holes 311 of the showerhead 300. RF power generated by the RF power supply 610 may be applied to the plasma source, and electromagnetic force may be generated in the chamber 620. The electromagnetic force may excite the process gas between the substrate support assembly 200 and the showerhead 300 into plasma. The plasma may be supplied to treat the substrate W. The plasma may be used to perform an etching process.

Figure 2:
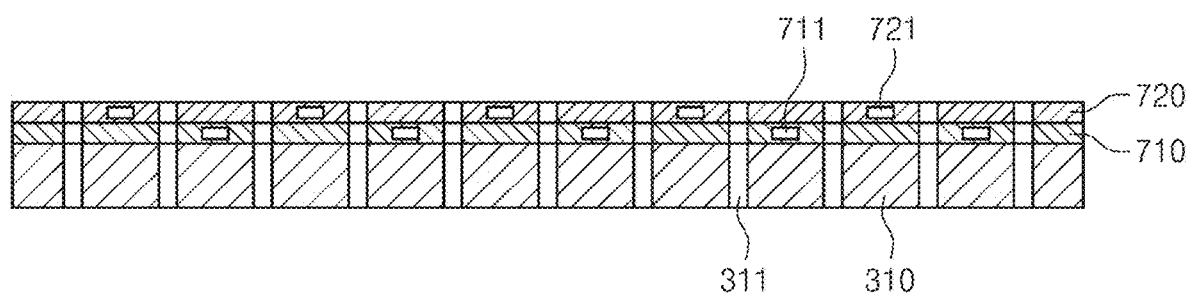
FIG. 2 is a view illustrating a heating member and a cooling member according to an embodiment of the inventive concept.

FIG. 2 is a view illustrating the heating member and the cooling member according to an embodiment of the inventive concept. Referring to FIG. 2, the heating member 710 and the cooling member 720 may be provided in a circular plate shape having a size corresponding to the gas distribution plate 310. The heating member 710 may include a plurality of heaters 711 and may heat the gas distribution plate 310 under the control of the control member 730. Furthermore, the cooling member 720 may include a plurality of coolers 721 and may cool the gas distribution plate 310 under the control of the control member 730. In FIG. 2, the heating member 710 and the cooling member 720 are illustrated as being sequentially disposed on the top side of the gas distribution plate 310. Without being limited thereto, however, the gas distribution plate 310, the cooling member 720, and the heating member 710 may be disposed in sequence from top to bottom.

Figure 3:
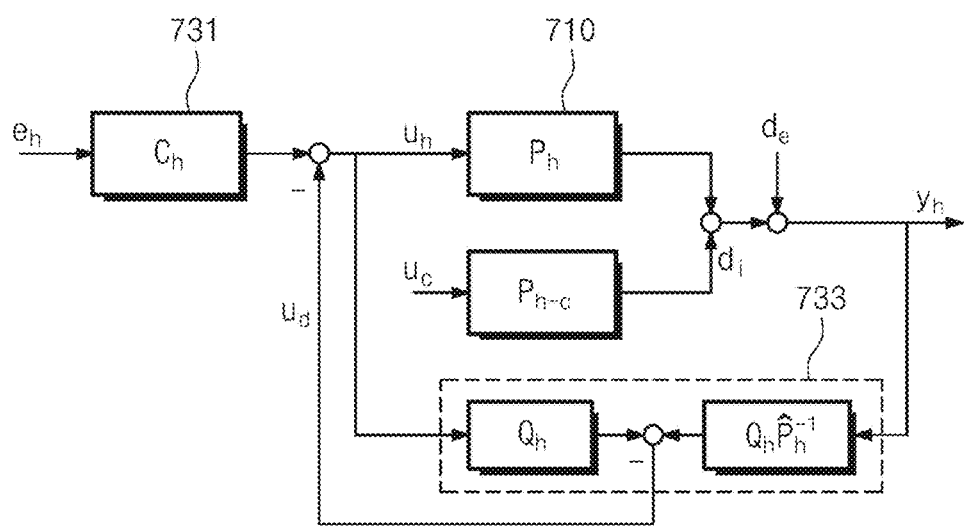
FIGS. 3 and 4 are views illustrating operations of the control member according to an embodiment of the inventive concept.
Figure 4:
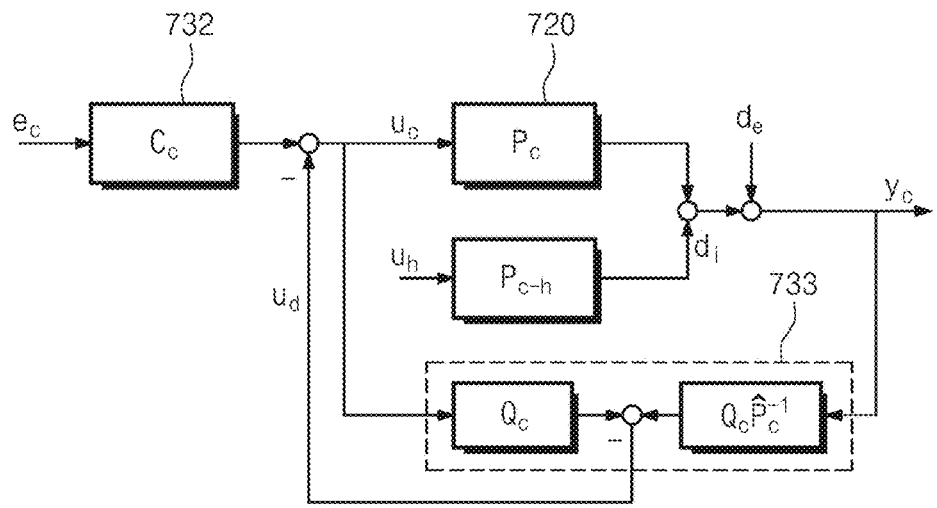

FIGS. 3 and 4 are views illustrating operations of the control member according to an embodiment of the inventive concept.

Referring to FIGS. 3 and 4, the control member 730 may control the heating member 710 and the cooling member 720, based on a correlation coefficient regarding an interaction of the heating member 710 and the cooling member 720 and a disturbance coefficient regarding an external influence. The control member 730 may include a heating controller 731 that controls the heating member 710 and a cooling controller 732 that controls the cooling member 720. Furthermore, the control member 730 may include a filter 733 that removes feedback inputs from input signals that are input to the heating member 710 and the cooling member 720, depending on the correlation coefficient and the disturbance coefficient. The feedback inputs may be calculated by Equation 1 below.

$$u_d = QP^{-1}(d_i + d_e) \quad (1)$$

Here, $u_d$ is the feedback input, Q is the transfer function of the filter, P is the transfer function of the heating member or the cooling member, $d_i$ is the correlation coefficient, and $d_e$ is the disturbance coefficient.

The transfer function of the filter 733 may be set by a user, or may be set in advance depending on the specification of the heating member 710 or the cooling member 720. Specifically, the transfer function may be given by Equation 2 below, and the characteristic of the transfer function may be determined by setting coefficients of a numerator polynomial and a denominator polynomial constituting the transfer function to specific values.

$$H(s) = \frac{b_m s^m + b_{m-1} s^{m-1} + \ldots + b_1 s + b_0}{a_n s^n + a_{n-1} s^{n-1} + \ldots + a_1 s + a_0} \quad [\text{Equation 2}]$$

Here, H(s) is the transfer function, $a_n$ and $b_m$ are the coefficients of the polynomials, and n and m are real numbers.

Furthermore, the transfer function of the heating member 710 or the cooling member 720 may also be expressed as in Equation 2 above, and coefficients of polynomials may be set in advance depending on the characteristic of the heating member 710 or the cooling member 720, or may be set by the user. That is, the characteristic of the transfer function of the filter 733 or the transfer function of the heating member 710 or the cooling member 720 may be determined by the coefficients of the polynomials, and appropriate coefficients may be set based on the characteristic of the heating member 710 or the cooling member 720, disturbances, and the like.

The control member 730 may supply, to the heating member 710 and the cooling member 720, signals obtained by removing, by the filter 733, the interaction of the heating member 710 and the cooling member 720 and the external influence from the input signals that are input to the heating member 710 and the cooling member 720. Accordingly, the control member 730 may more accurately control the temperature of the gas distribution plate 310 while being less affected by disturbances.

The filer 733 may be implemented with a Q filter, and the feedback input of the filter 733 may be derived from Equation 3 below.

$$y_h = d_e + d_i + P_h u_h$$

$$d = d_e + d_i$$

$$u_d = Q_h \hat{P}_h^{-1} y_h - Q_h u_h = Q_h \hat{P}_h^{-1} d + Q_h \hat{P}_h^{-1} P_h u_h - Q_h u_h \quad (3)$$

if $\hat{P}_h \approx P_h \rightarrow \hat{P}_h^{-1} P_h \approx 1$ then, $u_d \approx Q_h \hat{P}_h^{-1} d$ ($Q_h \hat{P}_h^{-1}$ is proper)

Here, $y_h$ is the output of the heating member, $d_e$ is the disturbance coefficient, $d_i$ is the correlation coefficient, $P_h$ is a set temperature of the heating member, $u_h$ is the input of the heating member, $u_d$ is the feedback input, and $Q_h$ is the transfer function of the filter.

Referring to FIG. 3, when $u_h$ is input from the heating controller 731 to the heating member 710, the output $y_h$ of the heating member 710 may be expressed as the sum of the disturbance coefficient $d_e$, the correlation coefficient $d_i$, and the product of the set temperature $P_h$ of the heating member 710 and the input $u_h$ of the heating member 710. The filter 733 may be provided between the heating controller 731 and the heating member 710 and may remove the feedback input $u_d$ from the input $u_h$ of the heating member 710. That is, the control member 730 of the inventive concept may remove the feedback input depending on the interaction of the heating member 710 and the cooling member 720 and the external influence by using the filter 733, thereby more accurately controlling the temperatures of the heating member 710 and the cooling member 720.

Furthermore, referring to FIG. 4, when $u_c$ is input from the cooling controller 732 to the cooling member 720, the output $y_c$ of the cooling member 720 may be expressed as the sum of the disturbance coefficient $d_e$, the correlation coefficient $d_i$, and the product of the set temperature $P_c$ of the cooling member 720 and the input $u_c$ of the cooling member 720. The filter 733 may be provided between the cooling controller 732 and the cooling member 720 and may remove the feedback input $u_d$ from the input $u_c$ of the cooling member 720.

Furthermore, the filter 733 may determine the Q value based on the correlation coefficient and the disturbance coefficient. Here, the Q value may refer to the value of each coefficient of polynomials constituting the transfer function of the filter 733. The filter 733 may change the Q value depending on the correlation coefficient and the disturbance coefficient, thereby minimizing the interaction of the heating member 710 and the cooling member 720 and the external influence. That is, the filter 733 may change the characteristic of the filter 733 by varying each coefficient of the polynomials constituting the transfer function of the filter 733 depending on the correlation coefficient and the disturbance coefficient.

According to another embodiment, the filter 733 may be implemented with a plurality of filters having different Q values. The control member 730 may switch the plurality of filters such that any one of the plurality of filters is provided in at least one of the heating member 710 and the cooling member 720 and may cause a filter having an appropriate Q value to be applied to at least one of the heating member 710 and the cooling member 720. Accordingly, the interaction of the heating member 710 and the cooling member 720 and the external influence may be further reduced when the temperature of the gas distribution plate 310 is controlled.

The control member 730 may apply the filter 733 to the heating member 710 and the cooling member 720 to control the heating member 710 and the cooling member 720 at the same time. Alternatively, the control member 730 may apply the filter 733 to only one of the heating member 710 and the cooling member 720 and may control only one of the heating member 710 and the cooling member 720.

The control member 730 may store, in a storage unit, the correlation coefficient and the disturbance coefficient removed from the input signals that are input to the heating member 710 and the cooling member 720, or may calculate the correlation coefficient and the disturbance coefficient using values measured by sensors. For example, the correlation coefficient and the disturbance coefficient may be values stored in the storage unit of the control member 730 in advance, and the control member 730 may calculate a feedback input using the correlation coefficient and the disturbance coefficient stored in advance. Furthermore, when at least one of the correlation coefficient and the disturbance coefficient is input to an input unit of the control member 730 from the outside, at least one of the correlation coefficient and the disturbance coefficient stored in the storage unit may be replaced with the value input to the input unit. In this case, the control member 730 may calculate a feedback input by using the correlation coefficient and the disturbance coefficient substituted.

According to another embodiment, the control member 730 may include a first sensor that measures the temperatures of the heating member 710 and the cooling member 720 and a second sensor that measures the temperature in the chamber 620. The first sensor may include a plurality of sensors located in the heating member 710 or the cooling member 720. The second sensor may be provided on the gas distribution plate 310, but is not limited thereto. The filter 733 may determine the correlation coefficient based on the temperatures of the heating member 710 and the cooling member 720 that are measured by the first sensor, and may determine the disturbance coefficient based on the temperature in the chamber 620 that is measured by the second sensor. The control member 730 may calculate a feedback input using the correlation coefficient and the disturbance coefficient that are determined based on the temperatures measured by the first sensor and the second sensor. Alternatively, the control member 730 may determine the disturbance coefficient based on the power and frequency of the RF power supply 610. Without being limited thereto, however, the control member 730 may determine the disturbance coefficient based on various factors affecting the temperature control of the gas distribution plate 310.

Figure 5:
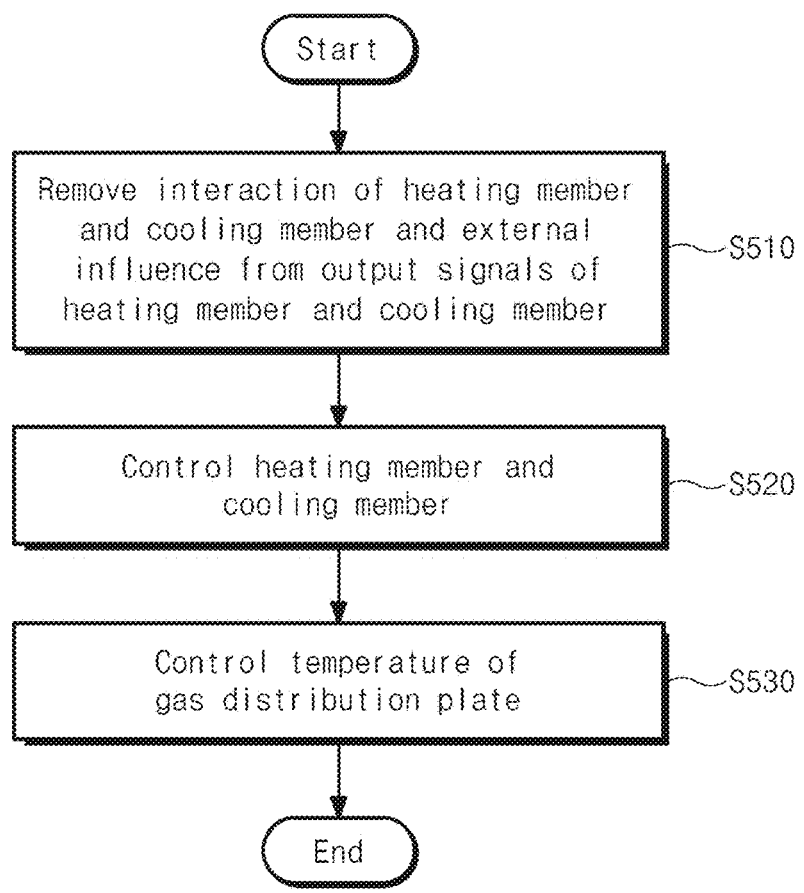
FIG. 5 is a flowchart illustrating a temperature control method according to an embodiment of the inventive concept.

FIG. 5 is a flowchart illustrating a temperature control method according to an embodiment of the inventive concept.

Referring to FIG. 5, the control member 730 may remove an interaction of the heating member 710 and the cooling member 720 and an external influence from output signals of the heating member 710 and the cooling member 720 (S510). Specifically, the control member 730 may control the temperatures of the heating member 710 and the cooling member 720, based on a correlation coefficient regarding the interaction of the heating member 710 and the cooling member 720 and a disturbance coefficient regarding the external influence. Here, the correlation coefficient and the disturbance coefficient may be values stored in the storage unit in advance. Alternatively, the correlation coefficient and the disturbance coefficient may be values input from the outside. In another case, the correlation coefficient may be a value that is set based on the temperatures of the heating member 710 and the cooling member 720 that are measured by the first sensor, and the disturbance coefficient may be a value set based on the temperature in the chamber 620 that is measured by the second sensor. The disturbance coefficient may be set based on the power and frequency of the RF power supply 610 of the plasma generation unit 600. Specifically, depending on the correlation coefficient and the disturbance coefficient, feedback inputs may be removed from input signals that are input to the heating member 710 and the cooling member 720. Here, the feedback inputs may be given by Equation 1 above. In the feedback inputs, the Q value may be determined based on the correlation coefficient and the disturbance coefficient.

Next, the control member 730 may control the heating member 710 and the cooling member 720 using the signals from which the feedback inputs are removed (S520), and therefore the control member 730 may control the temperature of the gas distribution plate 310 (S530).

According to another embodiment of the inventive concept, the control member 730 may control the temperatures of the heating member 710 and the cooling member 720, based on the correlation coefficient regarding the interaction of the heating member 710 and the cooling member 720. In this case, the control member 730 may remove the feedback inputs from the input signals that are input to the heating member 710 and the cooling member 720. Here, the feedback inputs may be calculated by Equation 4 below.

$$u_d = QP^{-1}d_i \quad (4)$$

Here, $u_d$ is the feedback input, Q is the transfer function of the filter, P is the transfer function of the heating member or the cooling member, and $d_i$ is the correlation coefficient.

The correlation coefficient may be a value stored in the storage unit in advance. Alternatively, the correlation coefficient may be a value input from the outside, a value determined based on the temperature in the chamber 620, or a value determined based on the power and frequency of the RF power supply 610 of the plasma generation unit 600. In the feedback inputs, Q values may be determined based on the correlation coefficient. Specifically, Q and P in Equation 4 may be the transfer function of the filter 733 and the transfer function of the heating member 710 or the cooling member 720, respectively. Q values may be coefficients of polynomials constituting the transfer function of the filter 733, and P values may be coefficients of polynomials constituting the transfer function of the heating member 710 or the cooling member 720. That is, in the feedback inputs, the Q values and the P values may be set based on the characteristics of the heating member 710 and the cooling member 720. Here, the Q values may be determined in consideration of the correlation coefficient. Accordingly, the interaction of the heating member 710 and the cooling member 720 may be minimized. In addition, the temperature control of the heating member 710 and the cooling member 720 may be performed by simultaneously controlling the heating member 710 and the cooling member 720.

According to the various embodiments of the inventive concept, the temperature of the gas distribution plate 310 may be more accurately controlled by minimizing the interaction of the heating member 710 and the cooling member 720 and the external influence or by minimizing the interaction of the heating member 710 and the cooling member 720.

In this specification, it has been described that the plasma generation unit 600 is of an inductively coupled plasma (ICP) type. Without being limited thereto, however, the plasma generation unit 600 may be implemented in a capacitively coupled plasma (CCP) type.

The above-described temperature control method may be implemented as a program that can be executed by a computer. The plasma generation unit control method may be executed in an application form and may be stored in a computer readable recording medium. Here, the computer readable recording medium may be, but is not limited to, a volatile memory such as a static RAM (SRAM), a dynamic RAM (DRAM) or a synchronous DRAM (SDRAM), a non-volatile memory such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM) or a ferroelectric RAM (FRAM), a floppy disk, a hard disk, or an optically readable medium (e.g., a storage medium such as a CD-ROM, a DVD, or the like).

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. For example, the components illustrated in the embodiments of the inventive concept can be implemented in a distributed manner. Likewise, the components described to be distributed can be implemented in a combined manner. Accordingly, the spirit and scope of the inventive concept should be determined by the technical idea of the claims, and it should be understood that the spirit and scope of the inventive concept is not limited to the literal description of the claims, but actually extends to the category of equivalents of technical value.

According to the various embodiments of the inventive concept, the temperature of the gas distribution plate may be more accurately controlled by minimizing the interaction of the heating member and the cooling member and the external influence.

Effects of the inventive concept are not limited to the aforementioned effects, and any other effects not mentioned herein may be clearly understood from this specification and the accompanying drawings by those skilled in the art to which the inventive concept pertains.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a chamber having a process space therein in which the substrate is treated;
    a substrate support assembly located in the chamber and including a support plate configured to support the substrate;
    a gas supply unit configured to supply gas into the chamber;
    a gas distribution plate configured to distribute the gas and supply the gas into the process space; and
    a temperature control unit configured to control temperature of the gas distribution plate,
    wherein the temperature control unit includes:
    a heating member configured to heat the gas distribution plate;
    a cooling member configured to cool the gas distribution plate; and
    a control member configured to control the heating member and the cooling member, based on a correlation coefficient regarding an interaction of the heating member and the cooling member and a disturbance coefficient regarding an external influence.

2. The apparatus of claim 1, wherein the control member includes:
    a filter configured to remove feedback inputs from input signals that are input to the heating member and the cooling member, depending on the correlation coefficient and the disturbance coefficient.

3. The apparatus of claim 2, wherein the feedback inputs are calculated by equation $$u_d = QP^{-1}(d_i + d_e),$$

where $u_d$ is the feedback input, Q is a transfer function of the filter, P is a transfer function of the heating member or the cooling member, $d_i$ is the correlation coefficient, and $d_e$ is the disturbance coefficient.

4. The apparatus of claim 3, wherein the filter determines the Q value based on the correlation coefficient and the disturbance coefficient.

5. The apparatus of claim 3, wherein the filter is implemented with a plurality of filters having different Q values, and
    wherein the control member further includes a controller configured to switch the plurality of filters such that any one of the plurality of filters is provided in the heating member and the cooling member.

6. The apparatus of claim 5, wherein the control member simultaneously controls the heating member and the cooling member.

7. The apparatus of claim 2, wherein the control member further includes a storage unit configured to store the correlation coefficient and the disturbance coefficient, and wherein the filter controls the heating member and the cooling member by using the correlation coefficient and the disturbance coefficient stored in the storage unit.

8. The apparatus of claim 7, wherein the control member further includes an input unit configured to receive the correlation coefficient and the disturbance coefficient from the outside, and
wherein when at least one of the correlation coefficient and the disturbance coefficient is input to the input unit, the storage unit replaces at least one of the correlation coefficient and the disturbance coefficient stored in the storage unit with the value input to the input unit.

9. The apparatus of claim 2, wherein the control member further includes:
a first sensor configured to measure temperatures of the heating member and the cooling member; and
a second sensor configured to measure temperature in the chamber, and
wherein the correlation coefficient is set based on the temperature measured by the first sensor, and the disturbance coefficient is set based on the temperature measured by the second sensor.

\* \* \* \* \*